(12) United States Patent
Haymon

(10) Patent No.: US 6,729,657 B2
(45) Date of Patent: May 4, 2004

(54) METHOD AND APPARATUS FOR FASTENING A TUBE TO A WALL

(75) Inventor: Perry D. Haymon, Mobile, AL (US)

(73) Assignee: Northrop Grumman Corporation, Woodland Hills, CA (US)

( * ) Notice: Subject to any disclaimer, the term of this patent is extended or adjusted under 35 U.S.C. 154(b) by 147 days.

(21) Appl. No.: 10/037,283

(22) Filed: Jan. 4, 2002

(65) Prior Publication Data

US 2003/0127853 A1 Jul. 10, 2003

(51) Int. Cl.⁷ .................................................. F16L 3/04
(52) U.S. Cl. ............................. 285/139.1; 285/139.2; 285/139.3; 285/136.1; 285/149.1
(58) Field of Search ..................... 285/139.1, 139.2, 285/139.3, 140.1, 142.1, 194, 203, 204, 206, 211, 212, 220, 136.1, 137.11, 222.1, 222.2, 222.3, 222.4, 222.5, 149.1

(56) References Cited

U.S. PATENT DOCUMENTS

| | | | | |
|---|---|---|---|---|
| 359,061 A | * | 3/1887 | Collins | 285/206 |
| 463,890 A | * | 11/1891 | Cross | 285/139.2 |
| 1,556,241 A | * | 10/1925 | Mueller | 285/193 |
| 1,574,690 A | * | 2/1926 | Radabaugh | 220/288 |
| 1,809,250 A | * | 6/1931 | Pendleton | 285/206 |
| 3,190,332 A | * | 6/1965 | Bernard | 383/96 |
| 3,195,932 A | * | 7/1965 | Morton | 285/200 |
| 3,749,424 A | * | 7/1973 | Greene | 285/139.1 |
| 4,179,038 A | * | 12/1979 | Rosan, Jr. | 220/243 |
| 4,479,667 A | * | 10/1984 | Major et al. | 285/39 |
| 4,637,638 A | * | 1/1987 | Rush et al. | 285/139.1 |
| 5,755,425 A | * | 5/1998 | Marolda | 251/144 |
| 5,950,663 A | * | 9/1999 | Bloomfield | 137/359 |
| 6,193,284 B1 | * | 2/2001 | King | 285/139.2 |
| 6,508,490 B1 | * | 1/2003 | Hoffman | 285/24 |

* cited by examiner

Primary Examiner—David Bochna
(74) Attorney, Agent, or Firm—Patti & Brill, LLC

(57) ABSTRACT

A method of fastening a tube (101) to a wall (401) includes fastening a first assembly (200) to an outer perimeter of the tube and inserting the tube into an opening in the wall (401) such that the first assembly (200) is disposed on a first side of the wall (401). The second assembly (1100) is fastened to the outer perimeter of the tube such that the second assembly (1100) is disposed on a second side of the wall (401). The second assembly (1100) is tightened toward the wall (401) such that an edge (503 or 505) protruding from the second assembly (1100) cuts the second side of the wall (401). The form of the method may be utilized to maintain electromagnetic shielding for the opening in the wall (401).

22 Claims, 7 Drawing Sheets

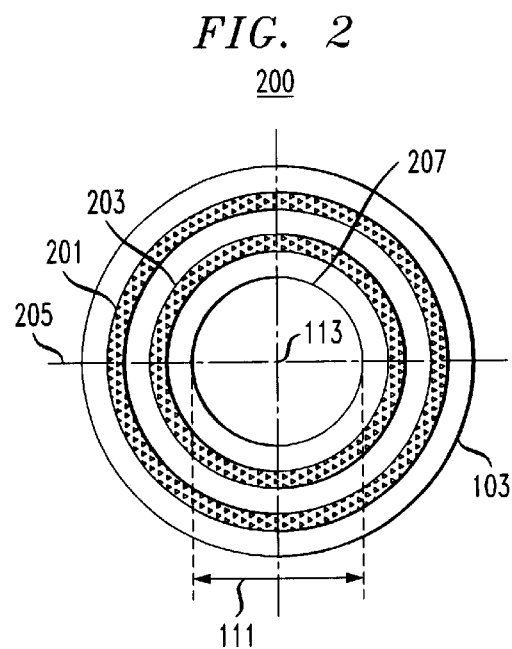
FIG. 2
200
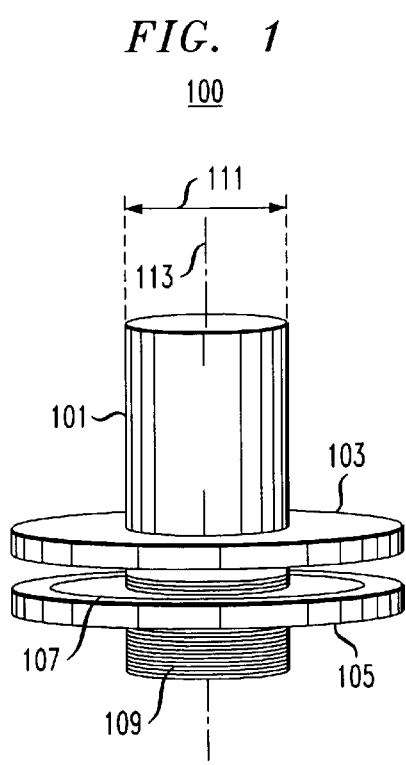
FIG. 1
100
FIG. 3
200
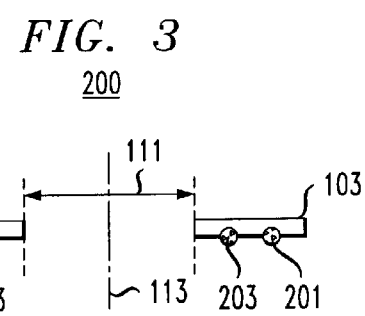
FIG. 4
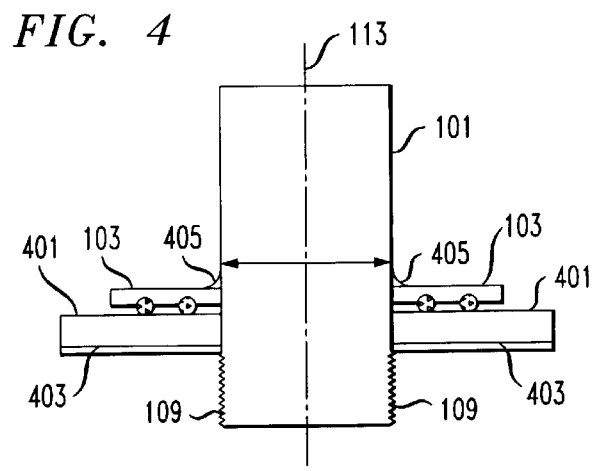

800

800

800

METHOD AND APPARATUS FOR FASTENING A TUBE TO A WALL

FIELD OF THE INVENTION

This invention relates to fastening tubes to walls, including but not limited to electromagnetic shielding for holes made in walls comprised of composite materials.

BACKGROUND OF THE INVENTION

Electromagnetic energy may adversely affect electronic equipment depending on the level and frequency of such energy. Electromagnetic energy is a concern for ships, vessels, aircraft, buildings, and other types of structures, whether military or commercial, that utilize electronic equipment. The structure of the ships, vessels, aircraft, buildings, and other types of structures must have penetrations or vias, which are holes placed in a structure to allow distributed systems, such as air, water, power, communications, and so forth, to pass into and through a space or compartment. Although these penetrations allow cables, pipes, vents, light, and so forth to pass through a structure, these penetrations also permit electromagnetic energy to pass.

Due to the conductive nature of metal, the material most often used in the construction of ships, the electromagnetic energy may be reduced in penetrations using conventional methods such as stuffing tubes, pipe penetrations, and flanges for ventilation, all of which may be welded. Steel, however, corrodes, thereby reducing the life of the object formed from steel.

Today's ships, aircraft, and other vessels are being manufactured using composite structures as a building block for many of these vessels. Examples of material used in composite structures include fiberglass, e-glass, vinyl esther, polyurethane, carbon fiber, glass or wood core, resins, and so forth. Composite structures tend to be corrosion-resistant because composite structures are nonmetallic, and hence do not rust. As a result, however, composite structures do not provide electromagnetic protection unless they have a conductive material built into the composite structure to provide electromagnetic shielding. Such a material is typically built on the inner part of the composite structure, so that the conductive material, which tends to be metal, is not exposed to the elements and thus will not rust. This conductive material is typically grounded to provide a path for the electromagnetic energy to be dissipated.

Because locations that have electronic equipment that is sensitive to electromagnetic energy should be properly protected from electromagnetic energy, the electromagnetic energy levels need to be maintained within allowable limits. Because electronic equipment and other devices are typically routed to most compartments in a ship, aircraft, or vessel, it is likely that a cable, pipe, or other type of system will need to pass through the structure, thereby placing an opening in the protective layer of shielding that is placed within the composite structure and allowing electromagnetic energy to pass through the penetration in the structure.

Methods that require exposing the grounding material in a composite structure typically utilize a pre-processing step that requires grinding, sanding, or some other method to expose the conductive grounding material within the composite structure. Because the conductive grounding material is encased within a resin that is part of the composite structure, exposing the grounding material is usually very difficult and time-consuming process to adequately access the grounding structure within the composite material.

Accordingly, there is a need for a method and apparatus for providing electromagnetic protection for penetrations through composite structures that is not difficult nor time-consuming and, if possible, avoids pre-processing.

BRIEF DESCRIPTION OF THE DRAWINGS

FIG. 1 is a diagram showing a round tube fastened to two assemblies in accordance with the invention.

FIG. 2 is a bottom view of a first assembly in accordance with the invention.

FIG. 3 is a cross-sectional view of the first assembly in accordance with the invention.

FIG. 4 is a cross-sectional view of a tube fastened to the first assembly and inserted into a wall in accordance with the invention.

SUMMARY

An embodiment of the present invention includes an apparatus comprising a first assembly that is fastened to an outer surface of a tube that extends through a wall, wherein the first assembly is on a first side of the wall. A second assembly has an edge protruding from its first surface and is fastened to the outer surface of the tube and engages a second side of the wall such that the edge cuts into the second side of the wall.

DESCRIPTION OF A PREFERRED EMBODIMENT

The following describes an apparatus for and method of fastening a tube that fits in an opening in a wall by utilizing an edge protruding from a surface of an assembly. When the wall is made of a composite structure containing a conductive material, and the edge pierces the wall to contact the conductive material, thereby creating an electromagnetic shield to compensate for the opening in the wall that was created to fit the tube. Gaskets are provided to seal the assembly from water and other environmental substances.

The diagram of FIG. 1 shows a tube that is intended to penetrate a wall, i.e., fit in a hole in the wall. The tube 101 may be hollow or solid; may be circular, rectangular, or any other shape; may be a pipe (such as those utilized to transport liquids), a conduit (such as those utilized to transport cable, wire, optics, and so forth), a duct (such a ventilation duct), or a cable (such as a shielded communication cable); or may be any other type of object that may extend through a wall and would benefit from electromagnetic shielding and/or connection and/or sealing as described herein.

A first assembly is fastened to the tube on a first side of the wall, and a second assembly is fastened to the tube on the second side of the wall. In the embodiment of FIG. 1, the first assembly includes a first plate 103 that is fastened to the tube 101 by welding. Also in this embodiment, a second assembly includes a second plate 105 that includes a threaded inner perimeter that mates to threading 109 on a section of the outer surface tube 101 such that the second assembly screws onto the threading of the tube 101. An embodiment showing an alternative way to fasten the second assembly to the wall is shown in FIG. 17 through FIG. 21. Other methods of fastening may be utilized while successfully practicing the present invention.

Figure 14:
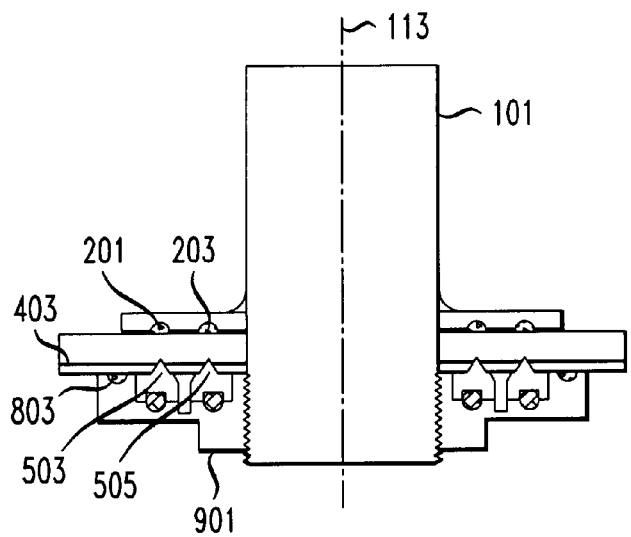
Figure 18:
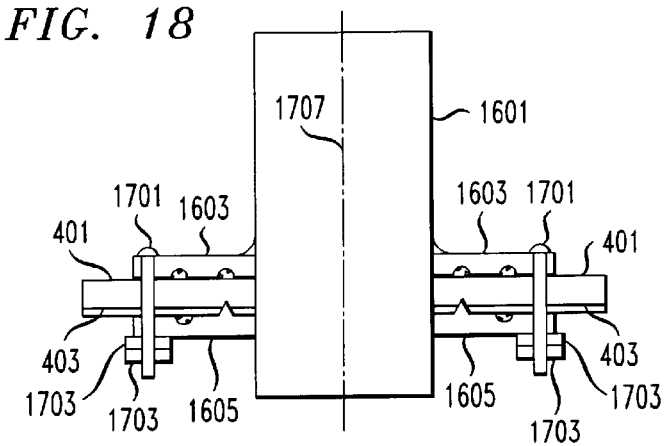

The second plate 105 includes one or more edges 107 that protrudes from a surface of the second plate 105 and cut into the composite structure when the second plate 105 is tightened to the wall. When the wall comprises a composite structure and the edge(s) 107 cuts into a conductive material in the composite structure, the resultant combination provides an electromagnetic shield, as will be described herein. Further details of this feature are shown in FIG. 14 and FIG. 18.

The plates 103 and 105 may have a circular shape, a square shape, or other type of shape as appropriate or desired. Although the shape of the external perimeter of the tube 101 is the same as the shape of the internal perimeter of the plates 103 and 105 in the examples shown in FIG. 1 and FIG. 16, these shapes need not match. The present invention may be successfully practiced with any shape of inner or outer perimeter of the plates 103 and 105, and any shape of outer perimeter of the tube 101.

A diagram of the first assembly 200 is shown in FIG. 2. In this embodiment, the first assembly comprises a plate 103 having two gaskets 201 and 203 disposed on one surface. The gaskets 201 and 203, shown as O-rings, are gaskets that provide weather sealing to keep water and other undesirable materials that may be present in the environment outside the assembly 200 from entering the space between the plate 103, the tube 101, and the wall.

The assembly 200 has an inner perimeter 207 that is slightly larger than the outer perimeter of the tube 101. One of skill in the art would recognize that the assembly's 200 perimeter 207 may be significantly larger and of different shape than the external perimeter of the outer surface of the tube 101 while still successfully practicing the invention. Advantage is gained when the tube 101 and the assembly 200 mate very closely, and thus, the shape of the outer perimeter of the tube 101 and the shape of the inner perimeter of the assembly 200 are substantially the same because the assemblies may be smaller and fit more closely to the pipe.

A block diagram showing a cross-sectional view of the assembly 200 through line 205 (FIG. 2) is shown in FIG. 3. The gaskets 201 and 203 are shown disposed along one surface of the plate 103 in the assembly 200.

A cross-sectional view of a tube 101 fastened to the first assembly 200 and inserted into a wall is shown in FIG. 4. In this embodiment, the plate 103 is welded to the tube 101 such that the weld 405 extends continuously around the perimeter of the tube 101 and connects the plate 103 to the tube 101. Other methods of fastening the assembly to the tube 101, such as a discontinuous weld, threading, and so forth may be utilized while successfully practicing the invention, although such alternative methods may not provide a sufficient weather seal. Also shown in FIG. 4 is the threading 109 on a section of the outer perimeter of the tube 101.

The assembly is shown inserted into a wall 401 that is made of composite material. This composite material may be any composite material as known in the art and contains an appropriate conductive material 403, such as a metal or carbon mat, which is appropriately grounded, as known in the art. The conductive material is typically embedded within the composite structure. The invention may also be successfully practiced on walls comprised of other materials, such as non-composite walls, including, for example, steel, plaster, and dry wall (gypsum).

Figure 5:
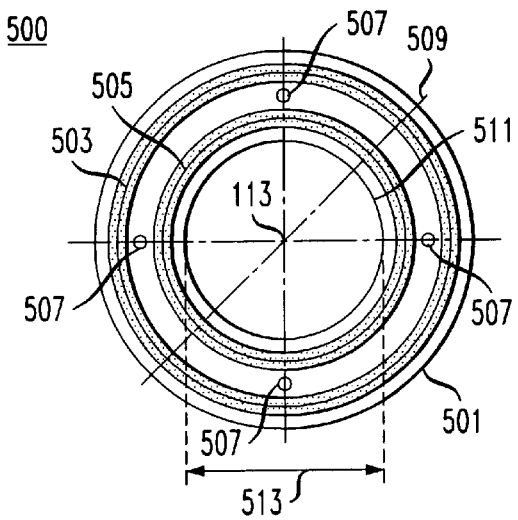
FIG. 5 is a top view of a first part of a second assembly in accordance with the invention.
Figure 21:
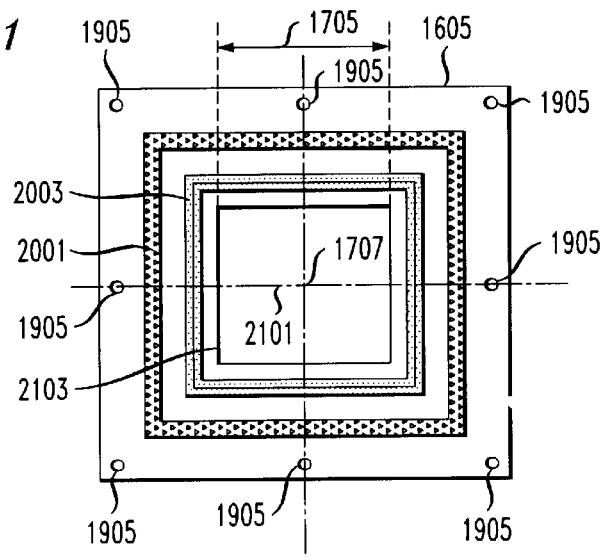
FIG. 21 is a top view of the second assembly in the alternative embodiment in accordance with the invention.

A top view of a first part 500 of the second assembly is shown in FIG. 5. The assembly 500 includes a substrate 501 from which two edges 503 and 505 protrude. Although two edges 503 and 505 are shown in this embodiment, the present invention may be successfully practiced utilizing one or more edges. In this embodiment, the edges 503 and 505 are shown as a continuous ring or circle that are concentric with the inner perimeter 511 of the first part 500 of the second assembly. The edges 503 and 505 are more advantageously able to provide an electromagnetic shield when contacting the conductive material in a composite structure when the edges 503 and 505 are annular, i.e., the edges form a perimeter that closes in on itself around the inner perimeter of the second assembly, and the edges need not be round, oval, square (as shown in FIG. 21), or take on any particular shape.

Figure 8:
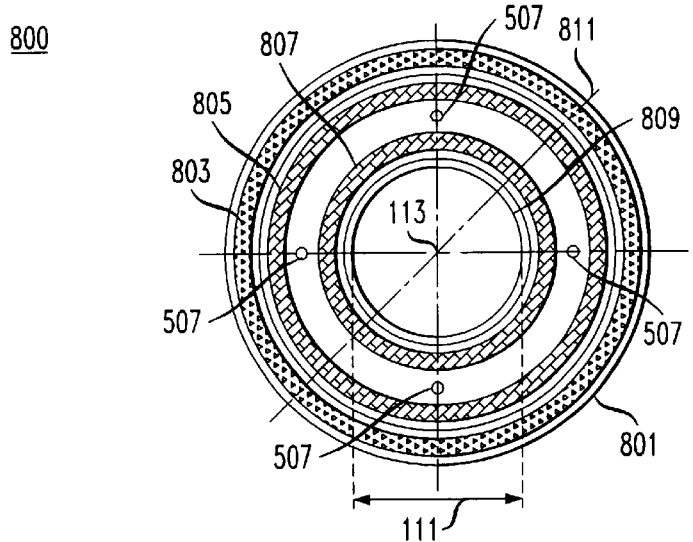
FIG. 8 is a top view of a second part of the second assembly in accordance with the invention.

In this embodiment, the center of the inner perimeter 511 is the same as the center point 113 of the tube 101. The substrate 501 also contains through-holes 507 that will be used to fasten the assembly 500 to another assembly 800 as shown in FIG. 8. These holes 507 are shown at 0°, 90°, 180°, and 270°, although any number of holes may be placed anywhere along the substrate as appropriate to fasten the assemblies 500 and 800. Although the assembly 500 is shown formed from a single piece of substrate, the assembly 500 may be comprised of multiple pieces.

Figure 6:
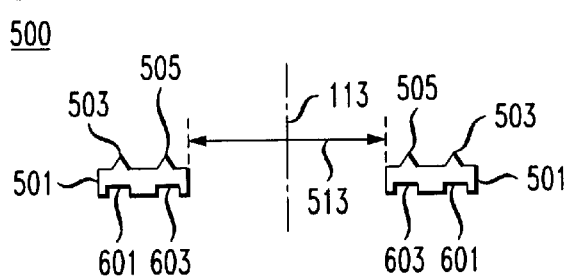
FIG. 6 is a cross-sectional view of the first part of the second assembly in accordance with the invention.

A view of a cross-section of the assembly 500 at line 509 (FIG. 5) is shown in FIG. 6. The cross-sectional view shows the edges 503 and 505 protruding from the substrate 501 of the assembly 500. The edges 503 and 505 are sharp and deep enough to cut sufficiently into the wall, and in this particular embodiment are shown to have a face on each side of the edges 503 and 505, which faces extend toward a surface of the substrate 501. The lower surface of the cross-sectional area of the assembly 500 shows two slots 601 and 603 that will be utilized in this embodiment to house springs as shown in FIG. 8 and FIG. 9.

Figure 7:
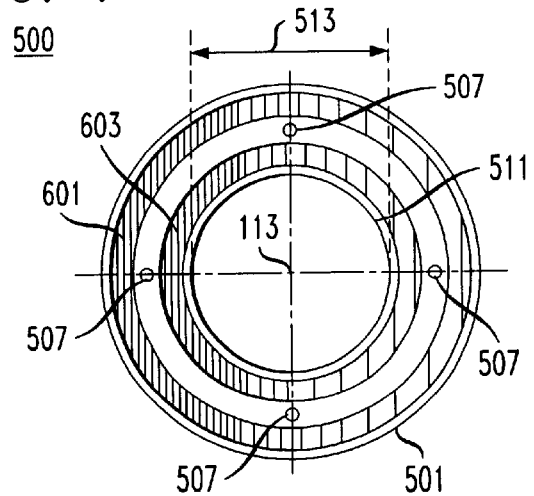
FIG. 7 is a bottom view of the first part of the second assembly in accordance with the invention.

A bottom view of the assembly 500 is shown in FIG. 7. The cutouts 601 and 603 for the springs are shown as circular rings that are concentric with the inner perimeter 511 of the assembly 500 in this embodiment. The cutouts 601 and 603 need not necessarily be concentric, but are advantageously matched to the shape of the springs that will be housed. The through-holes 507 are also shown in FIG. 7.

A diagram of a top view of a second part (assembly) 800 of the second assembly is shown in FIG. 8. A gasket 803 is disposed on a surface of a substrate 801 of the assembly 800. Two springs 805 and 807 are disposed on an inner part of the substrate 801. The springs 805 and 807 are utilized to provide pressure on the edges 501 and 503 of the assembly 500 against the wall 401. The gasket 803 and springs 805 and 807 are concentric in this embodiment, although they need not be concentric for successful practice of the present invention. The assembly 800 has an inner perimeter 809 that fits outside the outer perimeter or surface of the tube 101. In this embodiment, the inner perimeter of the assembly 800 is threaded to mate with the threading 109 on a section of the tube 101. In addition, holes 507 are drilled partially through the substrate 801, which holes are used to fasten the assembly 500 to the assembly 800, as will be described later.

Figure 9:
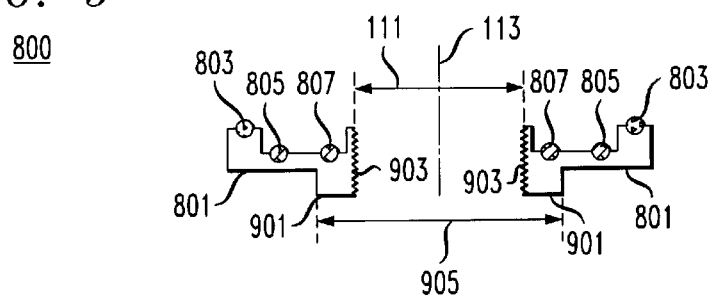
FIG. 9 is a cross-sectional view of the second part of the second assembly in accordance with the invention.

A diagram of a cross-sectional view of the assembly 800 through line 811 (FIG. 8) is shown in FIG. 9. The outer seal 803 is disposed on an upper surface of the substrate 801, whereas the springs 805 and 807 are disposed on a lower surface of the substrate 801. The under structure 901 of the substrate 801 is used to tighten the assembly 800 to the tube 101. The inner perimeter 809 of the substrate 801 is threaded 903 to mate with the threading 109 of the tube 101.

Advantageously, this embodiment shows that the springs 805 and 807 are circular and are disposed below each of the edges to provide pressure on the edges 503 and 505 as they press into the wall 401. Although two springs are shown in FIG. 8 and FIG. 9, one, two, or more springs may be utilized. The springs are optional, and need not be utilized, although they give the advantage of providing a constant pressure that prevents the loss of electrical contact between the edges 503 and/or 505 and the conductive material 403 over time.

Figure 10:
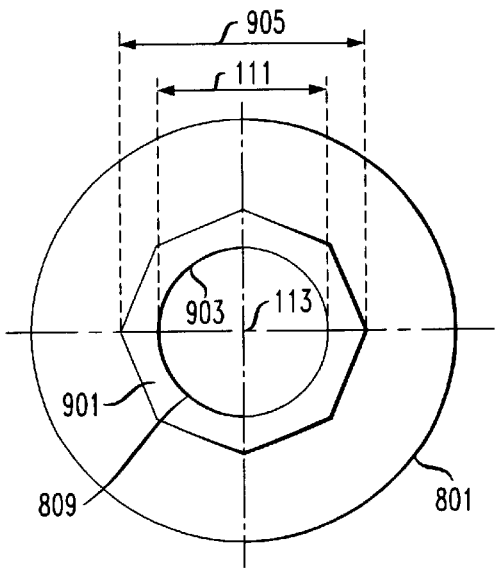
FIG. 10 is a bottom view of the second part of the second assembly in accordance with the invention.

A diagram showing a bottom view of the assembly 800 is shown in FIG. 10. The lower structure 901 of the substrate 801 forms an octagonal shape 901 for the purpose of tightening the assembly 800 onto the tube 101 via the threads 903 and 109 that are present on the assembly 800 and tube 101, respectively. Although the lower structure 901 shows an octagonal shape, the lower surface may be a hexagon, star, or other type of shape that may be easily gripped in order to fasten the assembly 800 to the tube 101.

Figure 11:
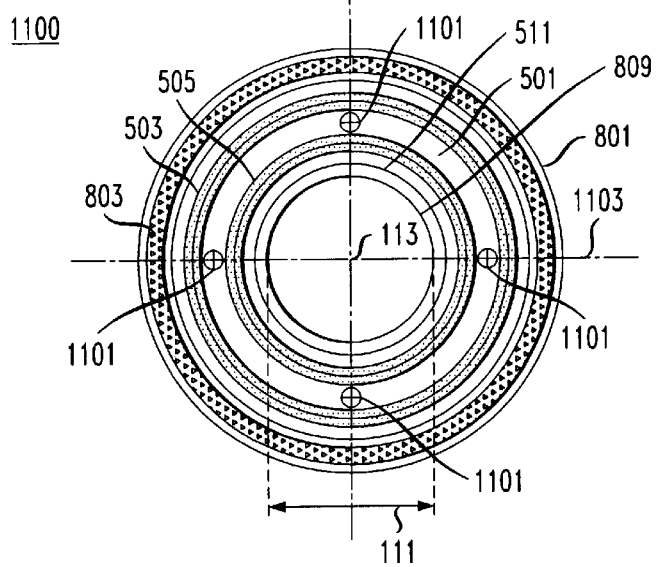
FIG. 11 is a top view of the second assembly in accordance with the invention.

A diagram showing a bottom view of the assembly 500 coupled to the assembly 800 to form a combined assembly 1100 is shown in FIG. 11. The combined assembly 1100 is an example of the second assembly described with respect to FIG. 11. The combined assembly 1100, which forms the second assembly in this embodiment, utilizes the substrate 801 as its outer perimeter as well as its inner perimeter. The seal 803 and the edges 503 and 505 are shown as concentric circles in the combined assembly 1100 in this embodiment. The two assemblies 500 and 800 are fastened by screws 1101 fastened in the through-holes 507 shown in FIG. 5 and FIG. 8.

Figure 12:
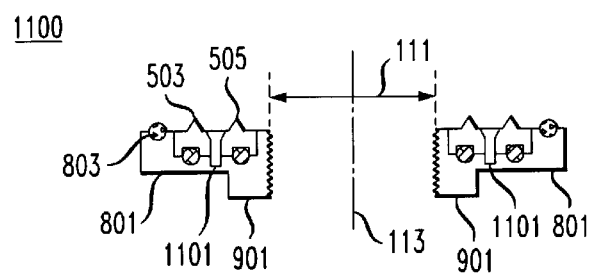
FIG. 12 is a cross-sectional view of the second assembly in accordance with the invention.

A cross-sectional view of the combined assembly 1100 at line 1103 (FIG. 11) is shown in FIG. 12. The two assemblies 500 and 800 are coupled such that the assembly 500 fits within a cut-out of the larger assembly 800, and the screws 1101 attach through the one assembly 500 and into the other assembly 801. The screws 1101 need not extend completely through the substrate 801, as shown in FIG. 12. The springs 805 and 807 are shown in the slots 601 and 603, respectively, and are encapsulated between the substrates of the assemblies 500 and 800. The springs 805 and 807 are in compression so as to provide continuous pressure between the two assemblies 500 and 800, and hence the edges 503 and/or 505, and the conductive material 403 over time.

Figure 13:
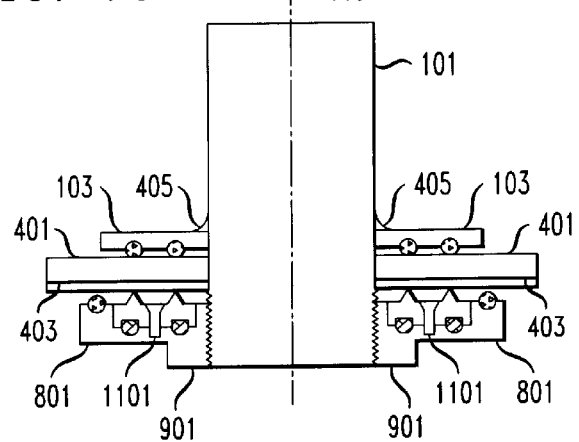
FIG. 13, FIG. 14, and FIG. 15 depict cross-sectional views of the tube fastened to the first assembly on one side of the wall and fastened to the second assembly on another side of the wall in accordance with the invention.

A block diagram of a cross-sectional view of a tube 101 having a first assembly 200 and a second assembly 1100 attached to the tube 101, with a wall 401 between the assemblies is shown in FIG. 13. The first assembly 200 (including plate 103) is disposed on one side of the wall 401, whereas the other assembly 1100 is disposed on the other side of the wall 401. In this particular embodiment, because the mating between the second assembly 1100 and the first assembly 200 is a threaded coupling, the second assembly 1100 is screwed onto the tube 101 and rotated. As the second assembly 1100 continues to be rotated, the engagement between the two assemblies causes the edges 503 and 505 to touch cut into the wall 401. As shown in FIG. 14, the edges 503 and 505 penetrate the wall 401 until they touch and/or break the conductive material 403, which is typically grounded.

When electromagnetic shielding is desired, the substrates 501 and 801, including the edges 503 and 505, and the tube are made of or coated with conductive material to provide electromagnetic shielding. Thus, when the edges 503 and 505 contact the grounding material 403, the combined structure of the tube 101 and the second assembly 1100 with the conductive material 403 in the wall provides electromagnetic shielding for the opening in the wall 401 in which the tube 101 is placed.

As the assemblies 200 and 1100 are compressed together by tightening the second assembly 1100 on to the tube 101, the gaskets 201, 203, and 803 are compressed, thereby providing a water tight seal between the assemblies 200 and 1100, the wall, and the tube 101. The gaskets 201, 203, and 803 are optional and need not be utilized if there is no need or desire to provide a seal. Although three gaskets are shown in this embodiment, any number of seals may be utilized as needed to provide the desired effect.

The first assembly 200 is advantageously placed on the side of the wall that is furthest from the grounding material 403. Thus, the second assembly 1100 is placed on the side of the wall that is closest to the conductive material 403. Because of this arrangement, the edges 503 and 505 may be shorter and need not cut into the wall as much as an implementation where the second assembly 1100 is on the side of the wall furthest from the conductive material, which implementation would require the edges to be longer and cut deeper into the wall.

Figure 15:
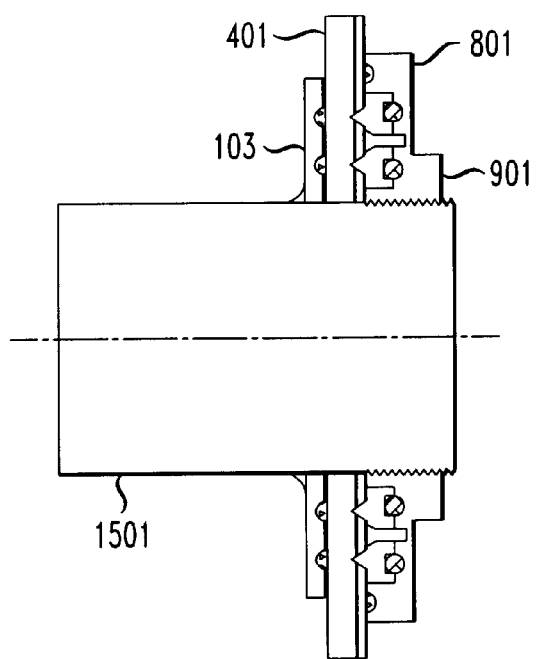

A diagram of a cross-sectional view of a larger tube 1501 is shown in FIG. 15. FIG. 15 also shows a horizontal orientation of the pipe. The present invention does not require a particular orientation of the assemblies with respect to the wall or any other object, nor need the assemblies connect to a particular type of device. As stated previously, the tube may be a hollow or solid, any shape, and may be utilized to transport various different types of items. No matter how large or small the tube 1501, nor the shape, the assemblies 200 and 1100 utilized for a small tube need not extend any further away from a larger tube.

Figure 16:
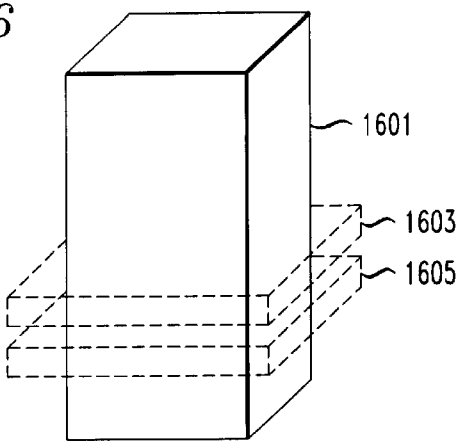
FIG. 16 is a diagram showing a rectangular tube fastened to two assemblies in an alternative embodiment in accordance with the invention.

A diagram showing a rectangular tube 1601 and rectangular assemblies having rectangular plates 1603 and 1605 is shown in FIG. 16. Although the plates and tubes are the same shape, it is possible to use shapes that are different, as would be recognized by one of skill in the art.

Figure 17:
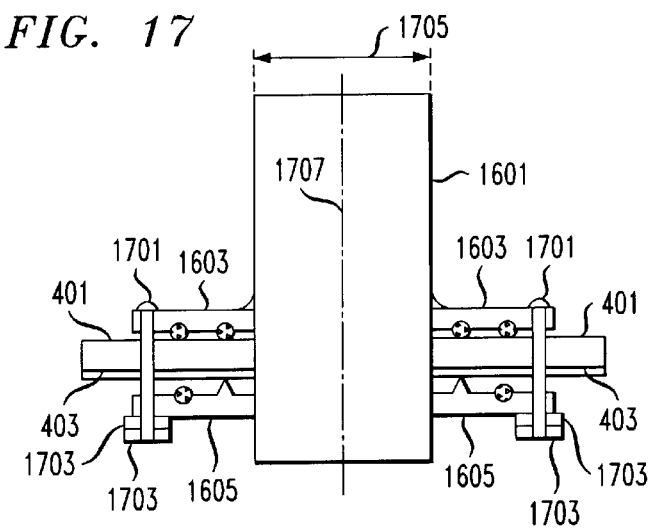
FIG. 17 and FIG. 18 depict cross-sectional views of the rectangular tube fastened to the first assembly on one side of the wall and fastened to the second assembly on another side of the wall in the alternative embodiment in accordance with the invention.

In the cross-sectional view of FIG. 17, the tube 1601 has an assembly/plate 1603 and 1605 attached on each side of the wall 401, but utilizing a number of screws 1701 and nuts 1703 to compress the plates together. The screws 1701 fit through mating holes in the plates 1603 and 1605 and the wall 401. As shown in FIG. 18, when the two assemblies are compressed, the edge of the second assembly extends into the conductive material 403, and the gaskets compress into the wall 401, thereby providing a water-tight seal as well as electromagnetic shielding without requiring threading of the tube 1601 or the assembly/plate 1605. Details of the plates utilized in this embodiment are shown in FIG. 19, FIG. 20, and FIG. 21.

Figure 19:
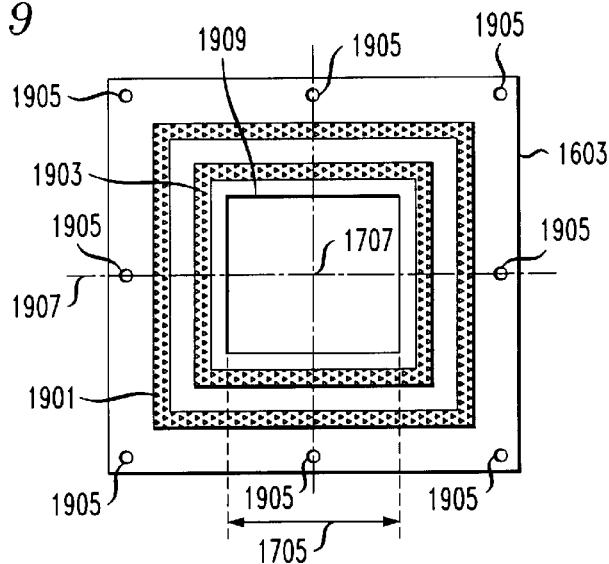
FIG. 19 is a bottom view of the first assembly in the alternative embodiment in accordance with the invention.

A diagram showing a bottom view of a first assembly/plate 1603 is shown in FIG. 19. Two gaskets 1901 and 1903 are shown along the bottom view of the assembly 1603. A number of through-holes 1905 are shown near the outer perimeter of the plate 1603 for the purpose of fastening the plates 1603 and 1605 together. The inner perimeter 1909 of the plate 1603 is designed to mate to the tube 1601, such that the perimeter 1909 is slightly larger than the outer perimeter 1705 of the tube 1601. One of skill in the art would recognize that close tolerances between the surfaces of the tube 1601 and plates 1603 and 1605 are not necessary to successfully practice the present invention.

Figure 20:
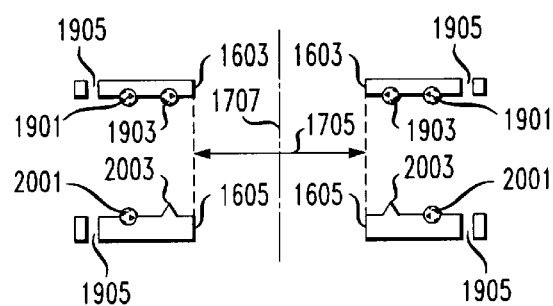
FIG. 20 is a cross-sectional view of the first assembly and the second assembly in the alternative embodiment in accordance with the invention.

A view showing cross-sections of the plates 1603 and 1605 through line 1907 (FIG. 19) and 2101 (FIG. 21), respectively, is shown in FIG. 20. The lower portion of the first plate 1603 shows the gaskets 1901 and 1903. Also shown are the through-holes 1905 for fastening the plates 1603 and 1605. A gasket 2001 and an edge 2003 are present on the upper surface of the second plate 1605. The second plate 1605 also has mating through-holes 1905 for fastening the plates together.

A diagram showing a top view of the second plate 1605 is shown in FIG. 21. Through-holes 1905 are located to mate with the holes 1905 on the other plate 1603. In this example, the gasket 2001 is shown rectangular, similar to the rectangular gaskets shown in FIG. 19. The edge 2003 that protrudes from the plate 1605 is also rectangular in shape, although the shapes of the plates, gaskets, springs, slots, and tubes need not match for successful practice of the present invention.

Thus, this embodiment utilizes screws 1701 to hold the plates 1603 and 1605 together without requiring threading of the plates 1603 and 1605 or the tube 1601. The screws 1701 and nuts 1703 are advantageously made of conductive material in order to best maintain an electromagnetic shield, if one is to be implemented. Other options that are shown in this embodiment include only one edge 2003, no springs in the second assembly, and a simplified version of a plate assembly. One of skill in the art would recognize that the use of any number of gaskets, edges, springs, screws, and separation of threading and so forth, are a question of design choice that will not affect successful practice of the present invention.

Although the present teachings provides a novel approach to providing shielding from electromagnetic energy for openings or penetrations in walls, the teachings may be utilized in applications not requiring electromagnetic shielding, such as simple connections for a tube in a wall or other type of structure, where a quick and secure connection between the wall and the tube is desired, in which case the assemblies need not be made of conductive materials. The present teachings may also be applied to walls that are not composite structures, including steel or metal walls.

The present teachings provide a method and apparatus for providing electromagnetic shielding for openings in a composite wall that allow various different sizes and types of tubes to pass through. The method and apparatus may be utilized for steel walls or walls comprised of other materials, and may also be used as a method to connect a tube to a wall even when electromagnetic shielding is not desired, in which case the materials that form the assemblies need not be conductive.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An apparatus comprising:
    a first assembly that is fastened to an outer surface of a tube that extends through a wall, wherein the first assembly is on a first side of the wall;
    a second assembly having an edge protruding from a first surface of the second assembly, wherein the second assembly is fastened to the outer surface of the tube and engages a second side of the wall such that the edge cuts into the second side of the wall and contacts a material that is embedded within the wall.

2. The apparatus of claim 1, wherein the material comprises a conductive material, wherein the edge contacts the conductive material such that the edge, the second assembly, the tube, and the conductive material form an electromagnetic shield.

3. The apparatus of claim 2, wherein the wall comprises a corrosion-resistant material that embeds the conductive material within the wall.

4. The apparatus of claim 1, wherein the edge is annular.

5. The apparatus of claim 1, wherein the edge is continuous and encircles the tube.

6. The apparatus of claim 1, further comprising at least one gasket disposed between the first assembly and the first side of the wall to form an environmental seal.

7. The apparatus of claim 1, further comprising at least one gasket disposed between the second assembly and the second side of the wall to form an environmental seal.

8. The apparatus of claim 1, wherein the second assembly further comprises a second surface and at least one spring disposed between the edge and the second surface to promote a constant pressure between the edge and the material.

9. The apparatus of claim 1, wherein the first assembly and the second assembly are coupled by one or more screws.

10. An apparatus comprising:
    a first assembly that is fastened to an outer surface of a tube that fits in an opening in a wall;
    a second assembly that has a threaded inner perimeter that mates to a threaded section of the outer surface of the tube, wherein the second assembly comprises an edge protruding from a first surface of the second assembly such that when the second assembly is fastened onto the threaded section of the outer surface of the tube, the edge cuts into the wall and makes contact with a material that is embedded within the wall.

11. The apparatus of claim 10, wherein the material comprises a conductive material, wherein the first assembly, the second assembly, the tube, and the conductive material form an electromagnetic shield.

12. The apparatus of claim 10, wherein the edge is annular.

13. The apparatus of claim 10, wherein the edge is continuous and encircles the tube.

14. The apparatus of claim 10, further comprising at least one gasket disposed between the first assembly and the first side of the wall to form an environmental seal.

15. The apparatus of claim 10, further comprising at least one gasket disposed between the second assembly and the second side of the wall to form an environmental seal.

16. The apparatus of claim 10, wherein the second assembly further comprises a second surface and at least one spring disposed between the edge and the second surface to promote a constant pressure between the edge and the material.

17. A method comprising the steps of:
fastening a first assembly to an outer perimeter of a tube;
inserting the tube into an opening in a wall such that the first assembly is disposed on a first side of the wall;
fastening a second assembly to the outer perimeter of the tube such that the second assembly is disposed on a second side of the wall;
tightening the second assembly toward the wall such that an edge protruding from the second assembly cuts into the second side of the wall and contacts a material embedded within the wall.

18. The method claim 17, wherein the material comprises a conductive material, wherein the step of tightening the second assembly toward the wall such that the edge protruding from the second assembly cuts into the second side of the wall and contacts a material embedded within the wall comprises the step of:
contacting the conductive material such that the edge, the second assembly, the tube, and the conductive material form an electromagnetic shield.

19. The method of claim 17, wherein a section of the outer perimeter of the tube and an inner perimeter of the second assembly are threaded, wherein the steps of fastening the second assembly to the outer perimeter of the tube such that the second assembly is disposed on a second side of the wall comprises the step of:
screwing the second assembly onto the threaded section of the outer perimeter of the tube.

20. The method of claim 17, further comprising the step of disposing at least one gasket between the first assembly and the first side of the wall to form an environmental seal.

21. The method of claim 17, further comprising the step of disposing at least one gasket between the second assembly and the second side of the wall to form an environmental seal.

22. The method of claim 17, further comprising the step of disposing at least one spring between a second surface of the second assembly and the edge to promote a constant pressure between the edge and the material.

* * * * *